United States Patent
Verma

(10) Patent No.: US 9,425,814 B1
(45) Date of Patent: Aug. 23, 2016

(54) REDUNDANCY SCHEME FOR FLASH ASSISTED SUCCESSIVE APPROXIMATION REGISTER (SAR) ANALOG-TO-DIGITAL CONVERTER (ADC)

(71) Applicant: Samsung Electronics Co., Ltd., Gyeonggi-do (KR)

(72) Inventor: Ashutosh Verma, Santa Clara, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/052,452

(22) Filed: Feb. 24, 2016

Related U.S. Application Data

(60) Provisional application No. 62/265,665, filed on Dec. 10, 2015.

(51) Int. Cl.
| | |
|---|---|
| *H03M 1/00* | (2006.01) |
| *H03M 1/46* | (2006.01) |
| *H03M 7/16* | (2006.01) |
| *H03M 1/80* | (2006.01) |
| *H03M 1/06* | (2006.01) |
| *H03M 1/12* | (2006.01) |

(52) U.S. Cl.
CPC ............ *H03M 1/466* (2013.01); *H03M 1/462* (2013.01); *H03M 7/165* (2013.01); *H03M 1/00* (2013.01); *H03M 1/0641* (2013.01); *H03M 1/0695* (2013.01); *H03M 1/12* (2013.01); *H03M 1/804* (2013.01)

(58) Field of Classification Search
CPC .... H03M 1/12; H03M 1/804; H03M 1/0695; H03M 1/0641
USPC ....... 341/110, 156, 172, 161, 133, 155, 131, 341/162
See application file for complete search history.

(56) References Cited

U.S. PATENT DOCUMENTS

| | | |
|---|---|---|
| 6,587,066 B1 | 7/2003 | Somayajula |
| 6,844,840 B1 | 1/2005 | Melanson |
| 7,868,795 B2 | 1/2011 | Berens et al. |
| 8,009,072 B2 | 8/2011 | Rigby et al. |
| 8,164,504 B2 | 4/2012 | Cho et al. |
| 8,362,938 B2 | 1/2013 | Cho et al. |
| 8,416,115 B2 | 4/2013 | Araki et al. |
| 8,466,823 B2 | 6/2013 | Chio et al. |

(Continued)

OTHER PUBLICATIONS

Arian, Amir et al., Successive Approximation ADC with Redundancy Using Split Capacitive-Array DAC, Electrical Engineering (ICEE), 2011 19th Iranian Conference on . . . , May 17-19, 2011, pp. 4.

(Continued)

*Primary Examiner* — Joseph Lauture
(74) *Attorney, Agent, or Firm* — The Farrell Law Firm, P.C.

(57) ABSTRACT

Apparatuses, systems, and methods for Analog-to-Digital Converters (ADCs) are described. In one aspect, an ADC is described which uses a Flash-assisted ADC and a Successive Approximation Register (SAR) to provide digital approximations of an input analog voltage to a Capacitor Digital-to-Analog Converter (DAC), which generates a voltage from the digital approximations. The two voltages are compared and the comparison value used as the input for the SAR. After successive approximations, a digital combiner generates the digital conversion value from the outputs of the Flash-assisted ADC and the SAR. In one aspect, the bit cycles required for conversion are reduced by using redundancy and recombination.

20 Claims, 9 Drawing Sheets

(56) References Cited

U.S. PATENT DOCUMENTS

| | | | |
|---|---|---|---|
| 8,502,723 B2 | 8/2013 | Chen et al. | |
| 8,525,720 B2 | 9/2013 | Shah | |
| 8,742,971 B1 | 6/2014 | Tai et al. | |
| 2013/0044015 A1* | 2/2013 | Reinhold | H03M 1/1061 341/110 |

OTHER PUBLICATIONS

Chen, Shuo-Wei Michael et al., A 6-bit 600-MS/s 5.3-mW Asynchronous ADS in 0.13-μm CMOS, IEEE Journal of Solid-State Circuits, vol. 41, No. 12, Dec. 2006 Copyright; 2006 IEEE, pp. 2669-2680.

Chen, Shuo-Wei Mike et al., A 6b 600MS/s 5.3mW Asynchronous ADC in 0.13μm CMOS, 2006 IEEE International Solid-State Circuits Conference, Copyright 2006 IEEE, pp. 10.

Chio, U-Fat et al., Design and Experimental Verification of a Power Effective Fiash-SAR Subranging ADC, IEEE Transactions on Circuits and Systems-II: Express Briefs vol. 57, No. 8, Aug. 2010, Copyright 2010 IEEE, pp. 607-611.

Kapusta, Ron et al., A 14b 80 MS/s SAR ADC With 73.6 dB SNDR in 65 nm CMOS, IEEE Journal of Solid-State Circuits, vol. 48, No. 12, Dec. 2013 Copyright 2013 IEEE, pp. 3059-3066.

Lee, Chun C. et al., A SAR-Assisted Two-Stage Pipeline ADC, IEEE Journal of Solid-State Circuits, vol. 46, No. 4, Apr. 2011, Copyright 2011 IEEE, pp. 859-869.

Kuttner, Franz, A 1.2V 10b 20MSample/s Non-Binary Successive Approximation ADC in 0.13μm CMOS, 2002 IEEE International Solid-State Circuits Conference Copyright 2002 IEEE, pp. 4.

Lee, Sunghyuk et al., A 1 Gs/s 10b 18.9 mW Time-Interleaved SAR ADC with Background Timing Skew Calibration, IEEE Journal of Solid-State Circuits, vol. 49, No. 12 Dec. 2014, Copyright 2014 IEEE, pp. 2846-2856.

Lewis, Stephen H. et al., A Pipelined 5-Msample/s 9-bit Analog-to-Digital Converter, IEEE Journal of Solid-State Circuits, vol. SC-22, No. 6, Dec. 1987 Copyright 1987 IEEE, pp. 954-961.

Lin, David T. et al., A Flexible 500MHz to 3.6GHz Wireless Receiver with Configurable DT FIR and IIR Filter Embedded in a 7b 21MS/s SAR ADC, Copyright 2010 IEEE, pp. 4.

Liu, Chun-Cheng, a 10-bit 320-Ms/s Low-Cost SAR ADC for IEEE 802.11ac Applications in 20-nm CMOS, IEEE Asian Solid-State Circuits Conference, Nov. 10-12, 2014 Kaohsiung, Taiwan, Copyright 2014 IEEE, pp. 77-80.

Sung, Ba-Ro-Saim et al., A 6 bit 2 GS/s Flash-Assisted Time-Interleaved (FATI) SAR ADC with Background Offset Calibration, Copyright 2013 IEEE, pp. 281-284.

Waho, Takao, Non-binary Successive Approximation Analog-to-Digital Converters: A Survey, 2014 IEEE 4th International Symposium on Multiple-Valued Logic Copyright 2014 IEEE, pp. 73-78.

Liu, Chun-Cheng et al., A 10b 100MS/s 1.13mW SAR ADC with Binary-Scaled Error Compensation, 2010 IEEE International Solid-State Circuits Conference Copyright 2010 IEEE, pp. 386-388.

MA, Sijia et al., A Background Time-Skew Calibration for Flash-Assisted Time-Interleaved SAR ADCS with Redundant Check Bit, ICSICT2014, Guilin, China Copyright 2014 IEEE, pp. 3.

McCreary, James L., et al., All-MOS Charge Redistribution Analog-to-Digital Conversion Techniques—Part 1, IEEE Journal of Solid-State Circuits, vol. SC-10, No. 6 Dec. 1975, pp. 371-379.

Suárez, Ricardo E. et al., All-MOS Charge Redistribution Analog-to-Digital Conversion Techniques—Part II, IEEE Journal of Solid-State Circuits, vol. SC-10, No. 6 Dec. 1975, pp. 379-385.

McCreary, James et al., A High-Speed, All-MOS Successive Approximation Weighted Capacitor A/D Conversion Technique 1975 IEEE International Solid-State Ciruciits Conference, pp. 3.

Ning, Qiao et al., A 10-bit 50-MS/s reference-free low power SAR ADC in 0.18-μm SOI CMOS technology, Journal of Semiconductors, vol. 33, No. 9, Sep. 2012 Copyright 2012 Chinese Institute of Electronics, pp. 9.

Verma, Naveen et al., An Ultra Low Energy 12-bit Rate-Resolution Scalable SAR ADC for Wireless Sensor Nodes, IEEE Journal of Solid-State Circuits, vol. 42, No. 6, Jun. 2007 Copyright 2007 IEEE, pp. 1196-1205.

Wu, S. Y. et al., A 10-bit 100MS/s Time Domain Flash-SAR ADC, Electron Devices and Solid-State Circuits (EDSSC), 2014 IEEE International Conference, Jun. 18-20, 2014, pp. 2.

Xue, Chunying et al., An 11-Bit 200MS/S SAR ADC IP for Wireless Comunacation SOC, ICSICT, Guilin, China, Copyright 2014 IEEE, pp. 3.

Yang, Jing et al., A 1 Gs/s 6 Bit 6.7 mW Successive Approximation ADC Using Asynchronous Processing, IEEE Journal of Solid-State Circuits, vol. 45, No. 8, Aug. 2010 Copyright 2010 IEEE, pp. 1469-1478.

* cited by examiner

N-bit Binary-Weighted Capacitive DAC in SAR ADC

5-bit Binary-Weighted Capacitive DAC in SAR ADC

REDUNDANCY SCHEME FOR FLASH ASSISTED SUCCESSIVE APPROXIMATION REGISTER (SAR) ANALOG-TO-DIGITAL CONVERTER (ADC)

PRIORITY

This application claims priority under 35 U.S.C. §119(e) to a U.S. Provisional Patent Application filed on Dec. 10, 2015 in the United States Patent and Trademark Office and assigned Ser. No. 62/265,665, the entire contents of which are incorporated herein by reference.

FIELD OF THE DISCLOSURE

The present disclosure relates generally to analog-to-digital converters (ADCs), and more particularly, to flash-assisted successive approximation register (SAR) ADCs.

BACKGROUND

ADCs are used in a wide variety of fields as components within modules performing a large variety of tasks. In wireless communication systems, ADCs are widely used to, for example, convert a received analog signal into its digital form. See, e.g., *IEEE Standard for information technology—telecommunications and information exchange between systems—Local and metropolitan area networks—Specific Requirements—part* 11: *wireless LAN medium access control (MAC) and physical layer (PHY) specifications—amendment* 4: *enhancements for very high throughput for operation in bands below 6 GHz*, IEEE Std 802.11ac-2013 (Amendment to IEEE Std 802.11-2012), December 2013, which is hereby incorporated by reference in its entirety. Because of the speed of technological advance, there is always pressure to develop faster, smaller, and more efficient ADCs.

FIG. 1A has three simplified diagrams illustrating three types of ADCs: Flash, pipelined, and successive approximation register (SAR). See, e.g., Chen et al., "A 6-bit 600-MS/s 5.3-mW asynchronous ADC in 0.13-m CMOS," IEEE J. Solid-State Circuits, vol. 41, no. 12, pp. 2669-2680 (December 2006), from which FIG. 1 is based and which is hereby incorporated by reference in its entirety.

FIG. 1A also shows their relative power requirements and speed capabilities. Because its conversion operations occur in parallel, Flash is fast, capable of generating the digital value in a single clock cycle, regardless of the number N of bits. However, having all of those operations running in parallel is an enormous power drain and having all of the Flash comparators/components requires a large area. In essence, Flash's resource usage and cost increases exponentially as the number of bits increases. Instead of a fully parallel construction like Flash, a pipelined ADC divides the process into several comparison stages, the number of which is proportional to the number of bits. However, the pipelined topology also has problems of increasing complexity and power consumption.

SAR performs the conversion from analog to digital over multiple clock cycles using essentially an analog comparator, a digital-to-analog converter (DAC), and an approximation register (as part of the decoder in FIG. 1A) which determines the digital bit values over successive clock cycles. An N-bit SAR ADC uses only one comparator and takes only N clock cycles to complete conversion. In other words, if the digital value comprises 10 bits (or, equivalently, if the analog voltage is being converted to one of 1024 possible digital values), the conversion takes ten clock cycles. The total power consumption is substantially less than the other ADC topologies and, even though its speed is a fraction of the Flash ADC, its overall power efficiency is still the best of the three. Moreover, unlike other ADC topologies, there is no standby current, further reducing power consumption.

SAR ADC technology scales well and, because certain analog components such as amplifiers are not required, SAR ADCs are suitable for deep submicron semiconductor manufacturing.

Most SAR ADCs have a charge redistribution architecture, which is described below in reference to FIGS. 1B and 1C.

FIG. 1B is a simplified diagram of an N-bit binary-weighted capacitive DAC which can be used in a SAR ADC, such as the one shown in FIG. 1A. It comprises an array of capacitances with varying binary weights. The first capacitor, having capacitance $C_{common}$, corresponds to the MSB of the N-bit digital value. The second-to-last capacitor, having capacitance $C/2^{N-1}$, corresponds to the LSB of the N-bit digital value, while the last capacitor (having the same capacitance) is the termination capacitance for the DAC. Each capacitor (except the last) corresponds to a bit value in the N-bit digital value from highest to lowest. Generally speaking, each capacitor, starting with the MSB, is tested per clock cycle to determine whether it is a 1 or a 0. In simplistic terms, the resulting voltage should be the quantized version of the input voltage, where each capacitor switch will indicate a 1 or 0. As would be understood by one of ordinary skill in the art, the actual process is much more complex, involves many more steps and components, and, perhaps most importantly, the specific architecture used may differ widely from the one shown in FIG. 1B. The present description focuses on the pertinent matters of interest.

FIG. 1C is a diagram of an example of a binary-weighted capacitor DAC for conversion to a 5-bit value. FIG. 1C shows the DAC at the last step of the process, where the bits have been determined, and is based on a drawing from the seminal paper on charge redistribution ADCs, McCreary et al., "All-MOS Charge Redistribution Analog-to-Digital Conversion Techniques," IEEE J. Solid-State Circuits, vol. SC-10, no. 6, pp. 371-379 (December 1975), which is hereby incorporated by reference in its entirety.

In FIG. 1C, the bit values can be seen above each capacitor and correspond to the setting of the switches beneath. Because $b_4=0$, $b_3=1$, $b_2=0$, $b_1=0$, and $b_0=1$, the binary digital value of $V_{IN}$ is 01001, which is the decimal value 9. FIG. 1C also makes it more clear how the capacitances are binary weighted: the capacitance corresponding to $b_4$ ($=2^4=16$) is C; the capacitance corresponding to $b_3$ ($=2^3=8$) is C/2; the capacitance corresponding to $b_2$ ($=2^2=4$) is C/4; the capacitance corresponding to $b_1$ ($=2^1=2$) is C/8; and the capacitance corresponding to $b_0$ ($=2^0=1$) is C/16—i.e., the unit value is one-sixteenth the highest value.

As stated above, N decisions/clock cycles are required for an N-bit SAR ADC, and each decision must be accurate to the full resolution of the converter. The sequential nature of the algorithm makes it difficult to achieve both high speed and high accuracy. One of the challenges for charge redistribution architecture is the phenomena known as settling, which refers to the time it takes for the unstable ringing of a DAC capacitor to settle down after being switched to a new value. This occurs, to greater or lesser effect, at each clock cycle/decision, and can cause performance degradation. A simple way to remove the effects of ringing is to allow greater time between decisions, making the process even longer.

Another approach to ringing, as well as other problems with SAR ADC accuracy, is the use of redundancy, by, for example, using non-binary weighting (i.e., based on lower values than 2) (see, e.g., F. Kuttner, "A 1.2V 10b 20 MSamples/s Non-binary successive Approximation ADC in 0.13 um CMOS," 2002 IEEE Int'l Solid-State Circuits Conf. (ISSCC 2002), Session 10—High-speed ADCs, section 10.6, which is hereby incorporated by reference in its entirety) and/or by adding more capacitors (see, e.g., C.-C. Liu et al., "A 10b 100 MS/s 1.13 mW SAR ADC with Binary-Scaled Error Compensation," 2010 IEEE Intl Solid-State Circuits Conf. (ISSCC 2010) Dig. Tech. Papers, pp. 386-387, which is hereby incorporated by reference in its entirety). However, redundancy inevitably leads to additional components, logic, wiring, bit decisions/clock cycles, and so on.

SUMMARY

Accordingly, the present disclosure has been made to address at least the problems and/or disadvantages described above and to provide at least the advantages described below.

According to an aspect of the present disclosure, an Analog-to-Digital Converter (ADC) is provided, including a Capacitor Digital-to-Analog Converter (DAC) which receives digital approximations of an input analog voltage as input and generates an analog voltage based on the digital approximations as output, including a first DAC related to Most Significant Bits (MSBs) of the binary output, which uses thermometer coding, receives first digital approximations and generates a corresponding first analog voltage, including a plurality of capacitances of equal value $C_{common}$ and one or more capacitances of a different value $C_{red}$; and a second DAC related to Least Significant Bits (LSBs) of the binary output, which is non-binary, receives second digital approximations and generates a corresponding second analog voltage including a plurality of capacitances equalling the sum of binary capacitances of the LSBs subtracted by the one or more capacitances of a different value $C_{red}$; a comparator which generates a comparator value indicating the input analog voltage subtracted by the first analog voltage generated by the first DAC; a Successive Approximation Register (SAR) which receives the comparator value and generates the second digital approximations which are input to the second DAC, wherein the SAR repeats this process in successive approximation; a Flash-assisted ADC which receives the input analog voltage and generates first digital approximations which are input into the first DAC; and a digital combiner which receives the first digital approximations from the Flash-assisted ADC and the second digital approximations from the SAR and generates a binary output representing the conversion of the input analog voltage.

According to another aspect of the present disclosure, a broadband modem chip is provided, including an Analog-to-Digital Converter (ADC), including a Capacitor Digital-to-Analog Converter (DAC) which receives digital approximations of an input analog voltage as input and generates an analog voltage based on the digital approximations as output, including a first DAC related to Most Significant Bits (MSBs) of the binary output, which uses thermometer coding, receives first digital approximations and generates a corresponding first analog voltage, including a plurality of capacitances of equal value $C_{common}$ and one or more capacitances of a different value $C_{red}$; and a second DAC related to Least Significant Bits (LSBs) of the binary output, which is non-binary, receives second digital approximations and generates a corresponding second analog voltage, including a plurality of capacitances equalling the sum of binary capacitances of the LSBs subtracted by the one or more capacitances of a different value $C_{red}$; a comparator which generates a comparator value indicating the input analog voltage subtracted by the first analog voltage generated by the first DAC; a Successive Approximation Register (SAR) which receives the comparator value and generates the second digital approximations which are input to the second DAC, wherein the SAR repeats this process in successive approximation; a Flash-assisted ADC which receives the input analog voltage and generates first digital approximations which are input into the first DAC; and a digital combiner which receives the first digital approximations from the Flash-assisted ADC and the second digital approximations from the SAR and generates a binary output representing the conversion of the input analog voltage.

According to yet another aspect of the present disclosure, an Analog-to-Digital Converter (ADC) for converting input analog to an N-bit binary output, divided into Most Significant Bits (MSBs) and Least Significant Bits (LSBs), where $n_{MSB}$ is the number of bit positions in the MSBs and $M_L$ is the lowest bit position in the MSBs, and $L_H$ is the highest bit position in the LSBs, is provided, including a Capacitor Digital-to-Analog Converter (DAC) comprising $2^N$ capacitance units/LSBs, divided into a thermometer coded DAC including $2^{n_{MSB}}-2$ capacitances of equal value $C_{common}$, where $C_{common}=2^{M_L}$ capacitance units/LSBs; and 2 capacitances of value $C_{red}$; and a non-binary DAC including $L_{H+1}$ capacitances, as well as a termination capacitance equalling one capacitance unit/LSB; a Flash-assisted ADC which receives the input analog voltage and generates a $2^{n_{MSB}}$ bit thermometer coded input for the first DAC, where the lowest bit is for one of the capacitances of value $C_{red}$, the next $2^{n_{MSB}}-2$ bits are for the capacitances of equal value $C_{common}$, and the highest bit is for the other capacitance of value $C_{red}$; a Successive Approximation Register (SAR) which generates a $L_H+1$ bit input for the non-binary DAC; and a digital combiner which receives the $2^{n_{MSB}}$ bit thermometer coded output of the Flash-assisted ADC and, after successively approximated over $L_H+1$ cycles, the $L_H+1$ bit output of the SAR and generates a binary output representing the conversion of the input analog voltage, wherein the $2^{n_{MSB}}+2$ capacitances of the thermometer coded DAC and the $L_H+1$ capacitances, as well as a termination capacitance equalling one capacitance unit/LSB, in the non-binary DAC equal a total value of $2^N$ capacitance units/LSBs.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1A:
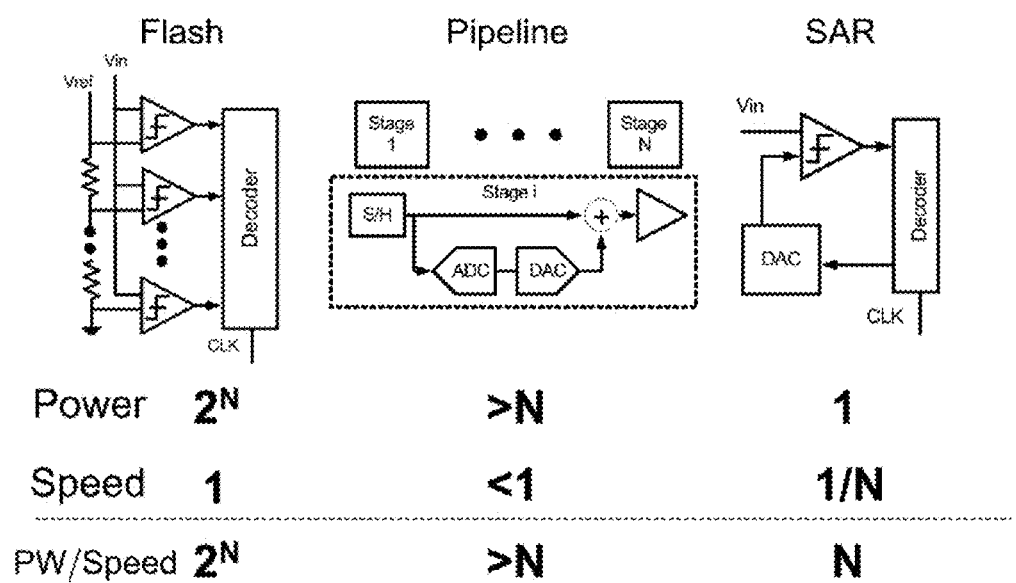
FIG. 1A has three simplified diagrams illustrating three types of ADCs: Flash, pipelined, and successive approximation register (SAR)

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

According to embodiments of the present disclosure, the speed, accuracy, and/or resource-usage of an ADC is improved by combining topologies. More specifically, Flash and SAR topologies are combined to create a hybrid Flash-assisted SAR ADC. The Flash ADC is used to approximate the coarse bits, or Most Significant Bits (MSBs), while the SAR ADC processes the fine bits, or Least Significant Bits (LSBs). In this manner, the MSBs are approximated in one clock cycle, while the LSBs are determined by multiple successive clock cycles, after which the output is combined to generate a result.

Figure 2:
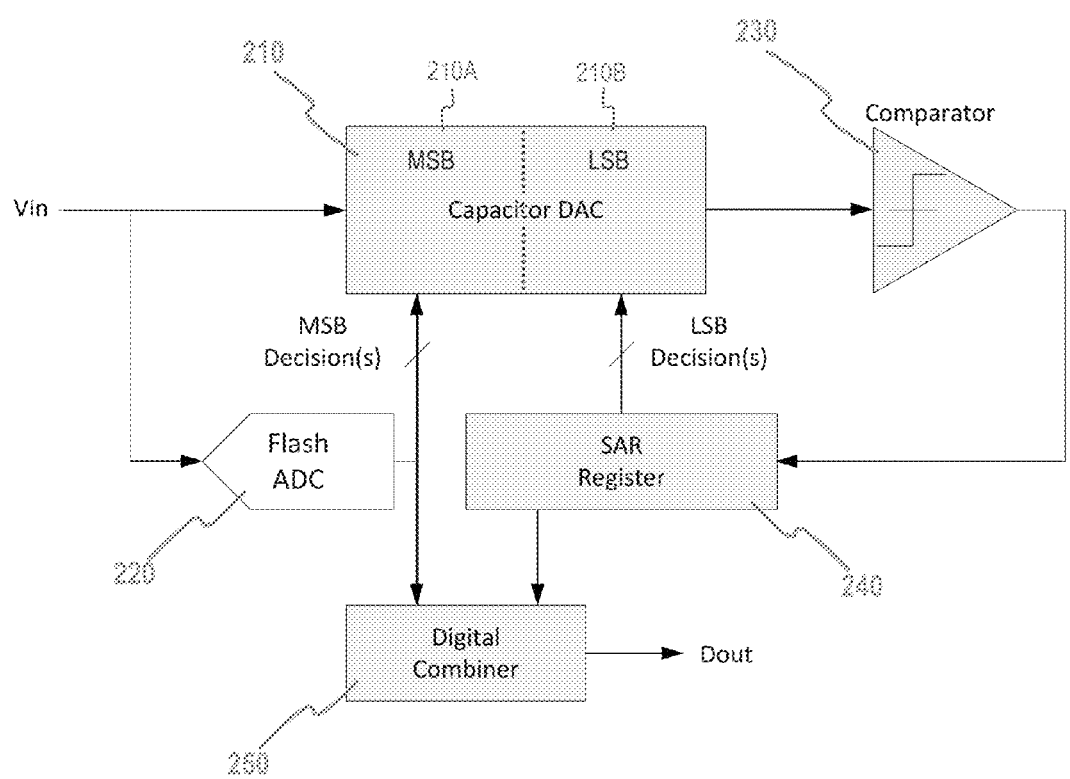
FIG. 2 is a simplified conceptual diagram of the components in a Flash-assisted SAR ADC according to a various embodiments of the present disclosure.

FIG. 2 is a simplified conceptual diagram of the pertinent components of a Flash-assisted SAR ADC according to an embodiment of the present disclosure. $V_{IN}$ is the incoming analog voltage value and $D_{out}$ is the digital output after conversion. In FIG. 2, $V_{IN}$ is input into both Capacitor DAC 210 and Flash ADC 220, which approximates the MSB decisions (in thermometer coding), which are input both into Capacitor DAC 210 and Digital Combiner 250. As would be understood by one of ordinary skill in the art, these inputs and outputs may be modified and remain within the scope of the present disclosure.

Capacitor DAC 210 receives three inputs, analog $V_{IN}$, the MSB decisions (in digital form) from Flash ADC 220, and the LSB decisions (in digital form) from SAR Register 240, which further approximates the LSB values every clock cycle using the output of Comparator 230. Roughly speaking, Comparator 230 compares the input analog $V_{IN}$ against an analog V generated by Capacitor DAC 210 using the input MSB and LSB digital values. Thus, the output of Comparator 230 provides guidance for each successive approximation by SAR Register 240.

As would be understood by one of ordinary skill in the art, FIG. 2 is a simplified diagram, the paragraphs above are a simplified overview, and a real-world implementation would be much more complex, require more stages and/or components, and would also vary depending on the requirements of the particular implementation. A more detailed example is illustrated in FIG. 3.

As seen in FIG. 2, Capacitor DAC 210 essentially comprises two parts, MSB DAC 210A and LSB 210B, which operate differently, mostly because of their different types of input and functioning. MSB DAC 210A receives all of the MSB bits in a single clock cycle and operates using thermometer coding, with all of its capacitors having the same weight. Of course, different embodiments of the present disclosure may vary/modify these details within the scope of the present disclosure—indeed, an MSB DAC according to an embodiment of the present disclosure discussed below both a set of equally-weighted capacitances and two other capacitances of a different weight. LSB DAC 210B receives different digital input over each successive clock cycle and operates using weighted capacitances. However, according to various embodiments of the present disclosure, the weights in the LSB DAC 210 are not necessarily binary, i.e., do not necessarily have a value of $2^x$, where x is an integer.

Figure 1B:
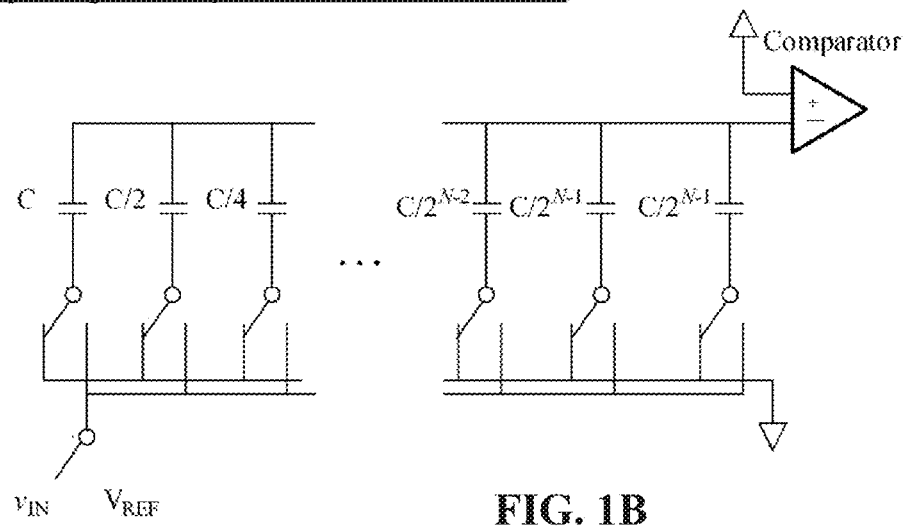
FIG. 1B is a simplified diagram of an N-bit binary-weighted capacitive DAC which can be used in a SAR ADC, such as the one shown in FIG. 1A.
Figure 1C:
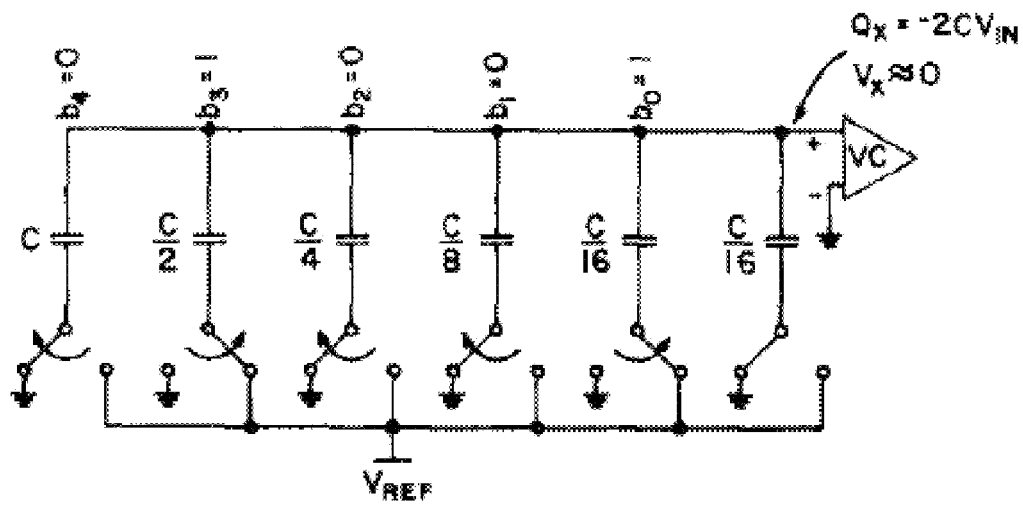
FIG. 1C is a diagram of an example of a binary-weighted capacitor DAC for conversion to a 5-bit value.

Before continuing, a clarification: in FIGS. 1B and 1C, the weighting, the capacitance values, were expressed in terms of C, e.g., C/2, C/16, etc.; however, capacitances are often labelled by the binary value of its corresponding bit. For example, in FIG. 1C, the capacitance values would be indicated, from right to left, as 16, 8, 4, 2, and 1. From this point on, this will be the labelling convention for indicating capacitance weight/value.

Figure 3:
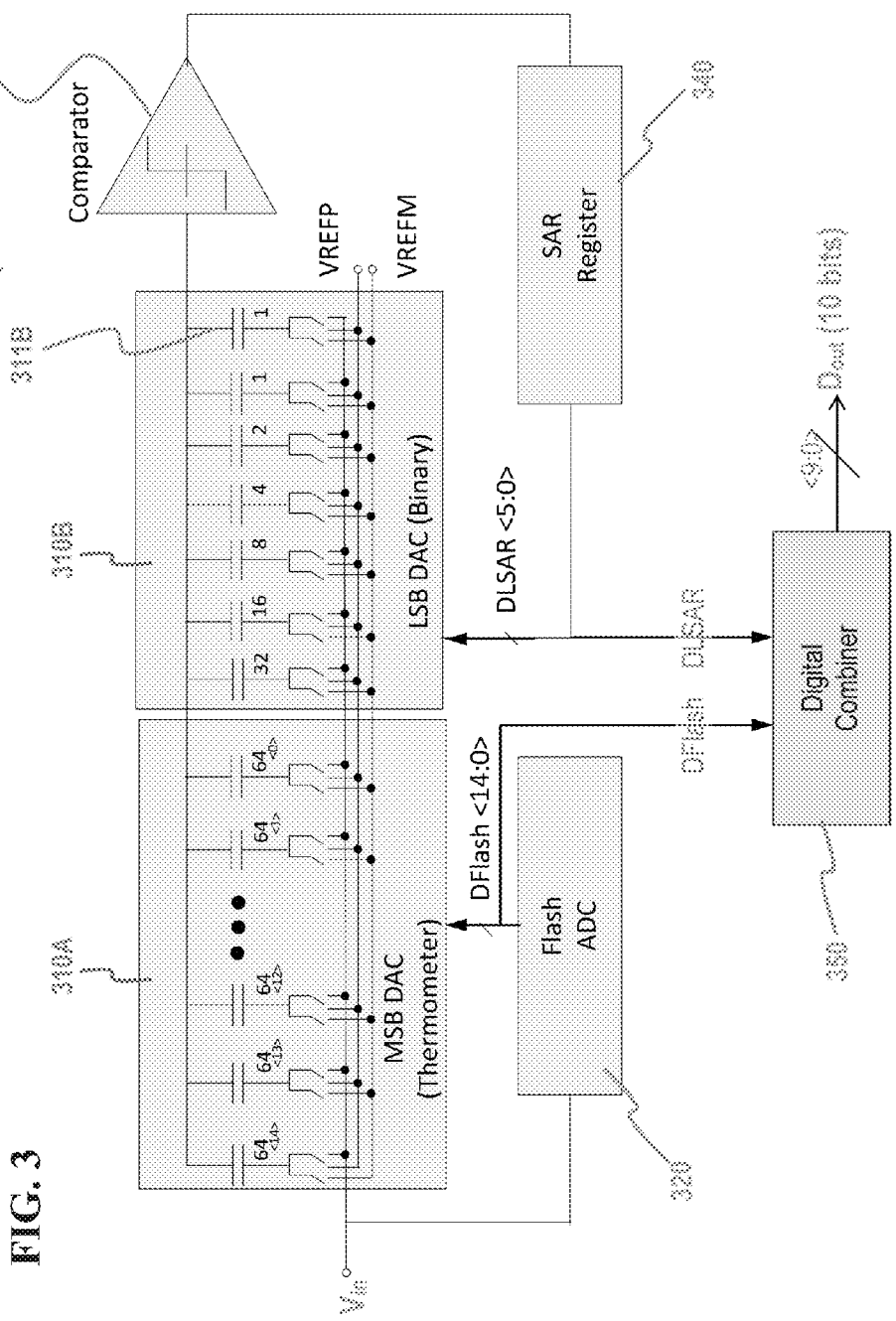
FIG. 3 is a ten bit digital code example of a Flash-assisted SAR ADC, such as shown in FIG. 2.

FIG. 3 is a ten bit digital code example of a Flash-assisted SAR ADC such as shown in FIG. 2. Like FIG. 2, $V_{IN}$ is the incoming analog voltage value and $D_{out}$ is the digital output after conversion. $V_{IN}$ is input into MSB DAC 310A, LSB DAC 310B, and Flash ADC 320, which approximates the MSB decisions (via thermometer coding: DFlash <14:0>), which are input both into MSB DAC 310A and Digital Combiner 350. LSB decisions (in digital form: DLSAR <5:0>) from SAR Register 340, which successively approximates the LSB values every clock cycle using the output of Comparator 330.

An N-bit ADC needs $2^N$ capacitor units in its DAC. Accordingly, the capacitor unit values in MSB DAC 310A and LSB DAC 310B must add up to $2^N=1024$. In the LSB DAC, there are simple binary-weighted capacitances which are equivalent to the final bit values, like in FIG. 1C. There is also an extra unit capacitance 311B at the right end. For example, $b_5$ has a value of $2^5=32$, thus the first capacitance from the left is "32"; $b_4$ has a value of $2^4=16$, thus the second capacitance from the left is "16"; and so on.

Since LSB DAC 310B is for the six lowest bits <5:0>, MSB DAC 310A is for the four highest bits <9:6>. However, as mentioned above, unlike LSB DAC 310B, MSB DAC 310A uses thermometer coding, so each capacitor has the same capacitance value. In this case, since $b_6$ is its lowest value, each capacitor is equivalent to $2^6=64$ capacitor units. Moreover, since there needs to be a total of 1024 capacitor units, and LSB DAC 310B has a total of 64 capacitor units, MSB DAC 310A must have 960 capacitor units, which is equal to 64×15, so there are 15 capacitances in MSB DAC 310A which are controlled by a codeword of 15 bits: DFlash <14:0>. Simply speaking, once successively approximated, Digital Combiner 350 performs 64×DFlash+DLSAR and provides ten bit output $D_{out}$<9:0>.

As would be understood by one of ordinary skill in the art, FIG. 3 is a simplified diagram, the paragraphs above are a simplified overview, and a real-world implementation would be much more complex, require more stages and/or components, and would also vary depending on the requirements of the particular implementation. For more such details, see, e.g., Kapusta et al., "A 14b 80 MS/s SAR ADC With 73.6 dB SNDR in 65 nm CMOS," IEEE J. Solid-State Circuits, vol. 48, no. 12, pp. 3059-3066 (December 2013); Lee et al., "A 1 GS/s 10b 18.9 mW Time-Interleaved SAR ADC with Background Timing Skew Calibration," IEEE J. Solid-State Circuits, vol. 49, no. 12, pp. 2846-2856 (December 2014); and U.S. Pat. No. 8,362,938 to Cho et al.; all of which are hereby incorporated by reference in their entireties.

However, the architecture of FIG. 3 does not allow for any offset mismatch in the Flash ADC. For example, when $V_{in}$=64 LSB+$\Delta$, the comparator offset output of Flash ADC 320 is 15'h0 instead of 14'b1, and SAR Register 340 saturates, providing an output of 6'h3F (decimal 63), which results in large integral nonlinearity (INL) and/or differential nonlinearity (DNL).

Figure 4:
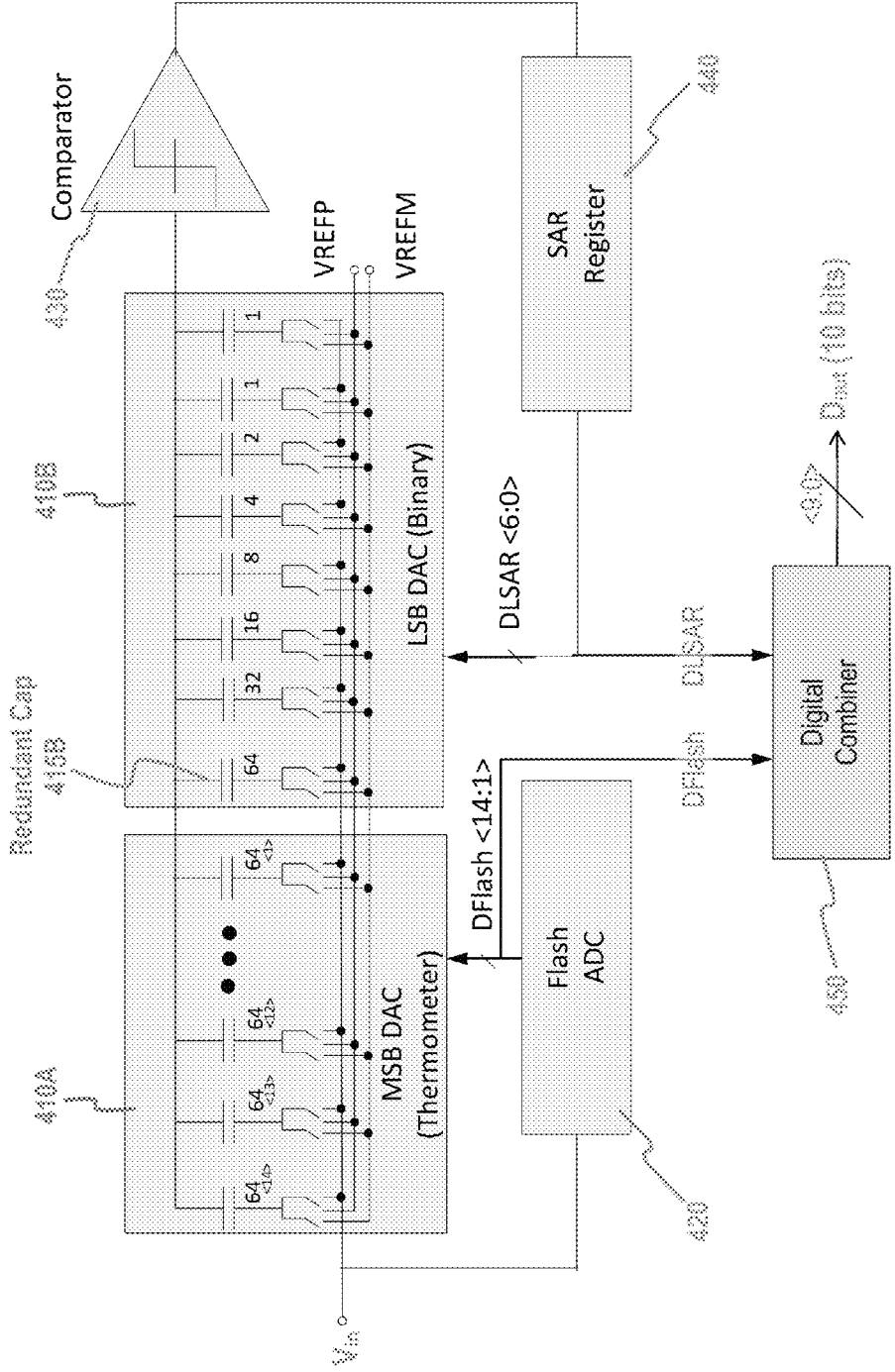
FIG. 4 is a ten bit digital code example of a Flash-assisted SAR ADC with added redundancy in accordance with various embodiments of the present disclosure.

To overcome this, one bit of redundancy can be added by moving one of the capacitances from the MSB DAC, i.e., out of Flash control, to the LSB DAC, i.e., under control of/driven by the SAR register. FIG. 4 provides an example of adding redundancy to the ten bit Flash-assisted SAR ADC of FIG. 3.

FIG. 4 is a ten bit Flash-assisted SAR ADC of FIG. 3 modified to have redundancy in accordance with the various embodiments of the present disclosure. Like FIGS. 2 and 3, $V_{IN}$ is the analog voltage value input into MSB DAC 410A, LSB DAC 410B, and Flash ADC 420 and $D_{out}$ is the digital output after conversion. Flash ADC 420 approximates the MSB decisions, which are input both into MSB DAC 410A and Digital Combiner 450. SAR Register 440 successively approximates LSB values every clock cycle using the output of Comparator 430 and inputs the LSB values into LSB DAC 410B.

However, as shown in FIG. 4, one of the capacitances has been removed from MSB DAC 410A and placed in LSB DAC 410B ("Redundant Cap 415B"). Only 14 capacitances are left in MSB DAC 410A and thus its control word becomes 14 bits (DFlash <14:1>), while the control output of SAR 440 increases to 7 bits (DLSAR <6:0>). Simplistically speaking, DFlash bit 0 is now Redundant Cap 415B in LSB DAC 410B. MSB DAC 410A has 64×14=896 capacitor units/LSBs, while LSB DAC 410B has 128 capacitor units/LSBs, adding up to the required 1024 capacitor units.

This redundancy requires Flash ADC 420 to shift down its thresholds (for each bit) by 32 LSB to provide symmetric redundancy. In Flash ADC 420, for example, the first comparator decision threshold (for capacitance/bit <1>) is set at 64*2−32=96 LSB, and the second comparator decision threshold (for capacitance/bit <2>) is set at 64*3−32=160 LSB and so on.

Accordingly, the problem discussed in reference to FIG. 3, i.e., the possible saturation of the SAR resulting in INL/DNL, is mitigated because the comparator offset is less than 32 LSB. When $V_{in}$=64 LSB+$\Delta$, then the Flash ADC output=14'h0 and the resulting input is well within the conversion range of SAR register (i.e., 0-128 LSB), preventing saturation.

However, the architecture of FIG. 4 is still sensitive to any error in DAC settling or reference settling in the SAR register as it is binary weighted and it also needs one extra cycle, i.e. 7 cycles for SAR conversion as opposed to the 6 cycles when there is no redundancy, i.e., FIG. 3.

One aspect of various embodiments of the present disclosure is the integration of non-binary recombination weighting into the design of the LSB DAC. Normally, the weighting is binary, each capacitance having a value of $2^n$, where n is an integer, which also matches its corresponding bit. The capacitance in the array corresponding to bit $b_n$ would be $2^n$, e.g., the capacitance corresponding to bit $b_5$ would be $2^5=32$. Under recombination weighting, the capacitor values are integers (and multiples of 2), but do not necessarily have a value of $2^n$, where n is an integer.

Simply speaking, in recombination weighting, redundancy is achieved by dividing the binary weights of the bits and redistributing the divided values among the various capacitors in the capacitor array. The criteria for recombination weighting is discussed in C.-C. Liu, "A 10b 320 MS/s Low-Cost SAR ADC for IEEE 802.11ac Applications in 20 nm CMOS," IEEE Asian Solid-State Circuits Conference (November 2014), pages 77-80 (hereinafter, C.-C. Liu), which is hereby incorporated by reference in its entirety.

For an N-bit SAR ADC according to recombination weighting, M bit-cycles (M>N) are needed to convert the N-bit digital code. The capacitor array comprises M+1 capacitors, ($C_M$ to $C_1$ descending in size, $C_0$ is the termination capacitor with the same size of a unit capacitor) which are composed of $2^N$ capacitor units/LSBs. The MSB capacitor $C_M$ includes $2^{N-1}-2^P$ (N-1>P) capacitor units. The $2^P$ capacitor units saved from the MSB capacitor $C_M$ are distributed into r (M>r>P) groups. In each of the r groups, the number of capacitor units is a power-of-2 number. The r groups are selectively allocated to r different capacitors among $C_{M-1}$ to $C_1$. Therefore, the $C_{M-i}$, one of the capacitors from $C_{M-1}$ to $C_1$, has either $2^{N-j}$ or $(2^{N-j}+2^k)$ capacitor units/LSBs, where $2^{N-j} \neq 2^k$, and $C_{M-1}$ must satisfy $C_{M-i} \leq C_{M-i-1} + \ldots + C_0$.

Using the recombinant method, the MSB weights can be expressed as a difference of two power-of-2 numbers ($2^{N-1}-2^P$). Except the MSB weights, the other bit weights can be expressed as a sum of two or only one power-of-2 numbers. Hence, extra compensative capacitors are not needed and the digital error correction logic is very simple to realize. See, e.g., C.-C. Liu.

Figure 5:
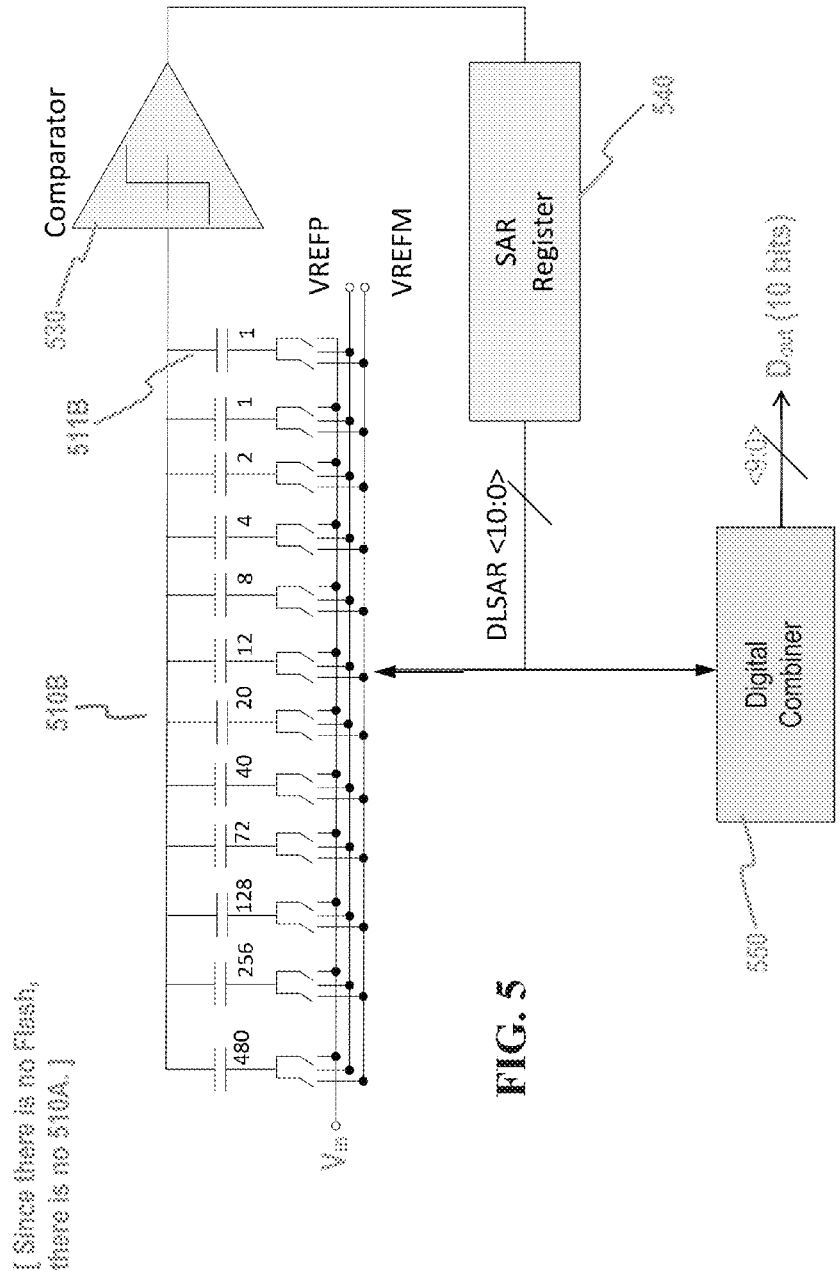
FIG. 5 is a ten bit digital code example of a SAR ADC using recombination in accordance with various embodiments of the present disclosure.

FIG. 5 is a ten bit SAR ADC using non-binary recombination in accordance with various embodiments of the present disclosure. The ADC in FIG. 5 is not Flash-assisted, and accordingly has no separate capacitor region which is Flash-controlled, instead, the DAC is completely driven/controlled by the SAR. Otherwise, Comparator 530 and SAR Register 540 are substantially the same as their corresponding components in FIGS. 3 and 4.

A typical binary SAR ADC has capacitances which match the respective bits. For example, the capacitor weights of a ten bit SAR ADC would be as shown in Table 1 below:

TABLE 1

| Capacitance | $C_9$ | $C_8$ | $C_7$ | $C_6$ | $C_5$ | $C_4$ | $C_3$ | $C_2$ | $C_1$ | $C_0$ |
|---|---|---|---|---|---|---|---|---|---|---|
| DLSAR bit | $b_9$ | $b_8$ | $b_7$ | $b_6$ | $b_5$ | $b_4$ | $b_3$ | $b_2$ | $b_1$ | $b_0$ |
| Weight | $2^9=512$ | $2^8=256$ | $2^7=128$ | $2^6=64$ | $2^5=32$ | $2^4=16$ | $2^3=8$ | $2^2=4$ | $2^1=2$ | $2^0=1$ |

As explained above, when using non-binary recombination, the top MSB is split up and the remainder distributed among the remaining bits and an extra bit is added. Obviously, the capacitances will no longer match corresponding bits of the final converted value, as they do in Table 1 above.

In FIG. 5, the top MSB, which is normally of weight $2^9=512$ as shown in Table 1 above, is split into two groups, 480 ($2^9-2^5$) and 32 ($2^5$). Next, the second group of 32 ($2^5$) cells are split into 8 ($2^3$), 8 ($2^3$), 4 ($2^2$), 4 ($2^2$), 4 ($2^2$), 2 ($2^1$), 1 ($2^0$) and 1 ($2^0$), respectively. Those weights are added to the LSBs. The new weighting ratio of capacitors $C_{11}$ to $C_1$ are 480 ($2^9-2^5$), 256 ($2^8$), 128 ($2^7$), 72 ($2^6+2^3$), 40 ($2^5+2^3$), 20 ($2^4+2^2$), 12 ($2^3+2^2$), 8 ($2^2+2^2$), 4 ($2^1+2^1$), 2 ($2^0+2^0$) and 1 ($2^0$), respectively, as shown in Table 2 below.

The SAR ADC using recombination in FIG. 5 needs 11 bit-cycles to convert 10 bits. The Digital Combiner 550 can compute $D_{out}$ by first calculating $b_{10} \times (2^9-2^5)+b_9 \times (2^8)+b_8 \times (2^7)+b_7 \times (2^6+2^3)+b_6 \times (2^5+2^3)+b_5 \times (2^4+2^2)+b_4 \times (2^3+2^2)+b_3 \times (2^2+2^2=2^3)+b_2 \times (2^1+2^1=2^2)+b_1 \times (2^0+2^0=2^1)+b_0 \times (2^0)$, and then turning the resulting value into a 10-bit binary value, which will be output as $D_{out}<9:0>$.

In various embodiments according to the present disclosure, redundancy, recombination weighting, and using a Flash ADC are integrated in such a manner to make it possible to reduce the number of cycles. In this manner, most of the benefits of using a flash ADC are retained while still relaxing the requirements for reference and DAC settling.

Figure 6A:
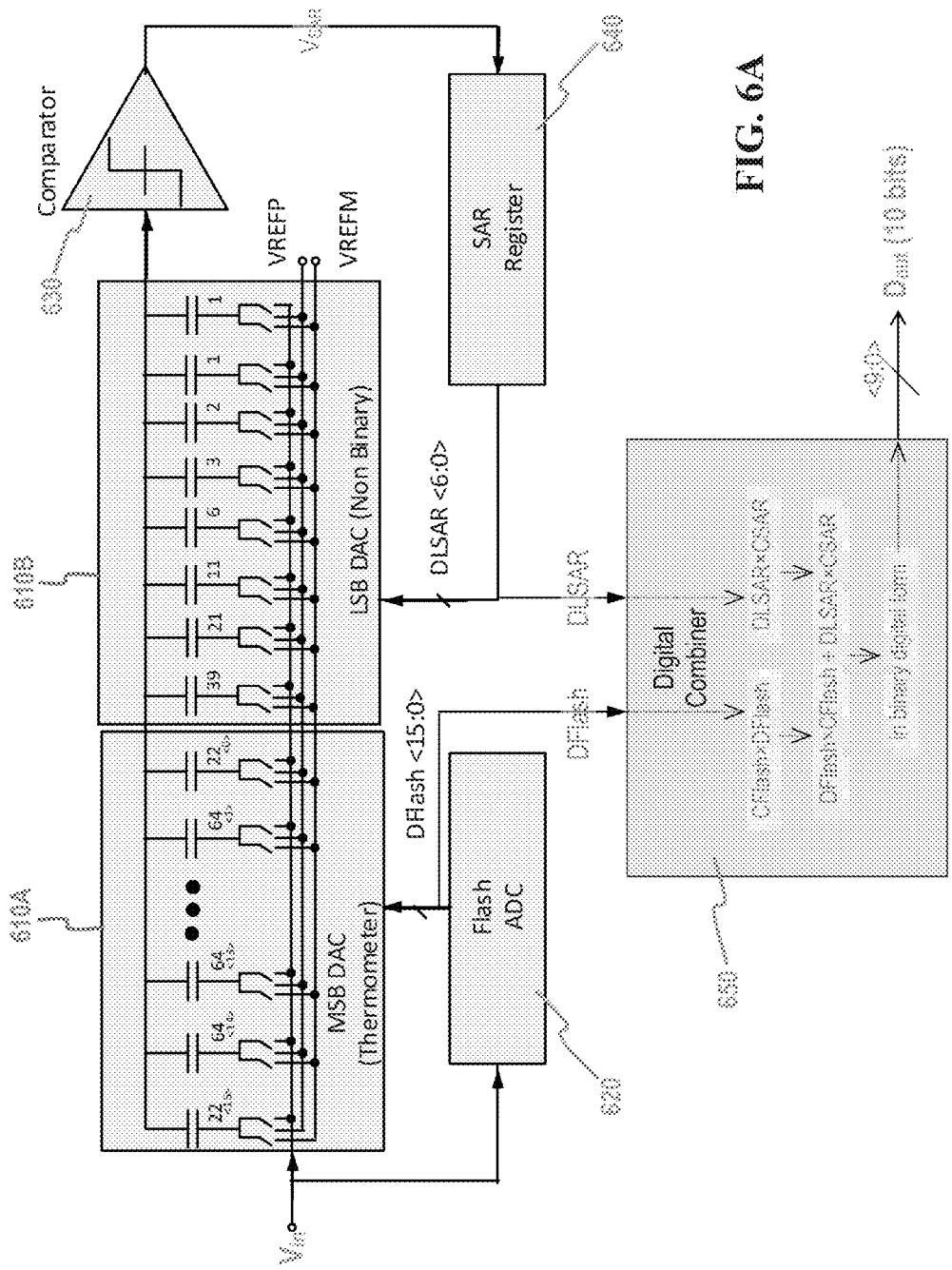
FIG. 6A is a ten bit digital code Flash-assisted SAR ADC according to an embodiment of the present disclosure.

FIG. 6A is a ten bit Flash-assisted SAR ADC using recombination and redundancy according to an embodiment of the present disclosure. The use of two additional capacitances/comparators in MSB DAC 610A/Flash ADC 620 in FIG. 6A makes it possible to reduce the number of extra cycles in comparison to the ADC in FIG. 4.

Like FIGS. 2-4, $V_{IN}$ is the analog voltage value input into MSB DAC 610A, LSB DAC 610B, and Flash ADC 620 and $D_{out}$ is the digital output after conversion. The 16 bit output DFlash <15:0> of Flash ADC 620 is input into both MSB DAC 610A and Digital Combiner 650. The 7 bit output DLSAR <6:0> of SAR Register 640 is input into both LSB DAC 610B and Digital Combiner 650.

By contrast to FIG. 4, capacitance units are not being moved from the MSB DAC to the LSB DAC, but rather capacitance units are being added to the MSB DAC and subtracted from the LSB DAC. As mentioned above, there are two additional capacitances in MSB DAC 610A in FIG. 6A: capacitance <0> in MSB DAC 610A, having a value of 22 capacitance units, and capacitance <15> in MSB DAC 610A, having a value of 22 capacitance units. The remaining capacitances are the same: 14 capacitances of 64 capacitance units/LSBs each, totalling 896 capacitance units, like MSB DAC 410A in FIG. 4. Accordingly, MSB DAC 610A has an overall total of 940 capacitance units/LSBS, 44 more than MSB DAC 410A. The extra 44 capacitance units/LSBs are recombined/subtracted from the LSB DAC 610B as shown in Table 3 below.

TABLE 3

| Capacitance | $C_6$ | $C_5$ | $C_4$ | $C_3$ | $C_2$ | $C_1$ | $C_0$ |
|---|---|---|---|---|---|---|---|
| DLSAR bit | $b_6$ | $b_5$ | $b_4$ | $b_3$ | $b_2$ | $b_1$ | $b_0$ |

TABLE 2

| Capacitance | $C_{10}$ | $C_9$ | $C_8$ | $C_7$ | $C_6$ | $C_5$ | $C_4$ | $C_3$ | $C_2$ | $C_1$ | $C_0$ |
|---|---|---|---|---|---|---|---|---|---|---|---|
| DLSAR bit | $b_{10}$ | $b_9$ | $b_8$ | $b_7$ | $b_6$ | $b_5$ | $b_4$ | $b_3$ | $b_2$ | $b_1$ | $b_0$ |
| Recombination | $2^9-2^5$ | $2^8$ | $2^7$ | $2^6+2^3$ | $2^5+2^3$ | $2^4+2^2$ | $2^3+2^2$ | $2^2+2^2$ | $2^1+2^1$ | $2^0+2^0$ | $2^0$ |
| Recombined Weight | 480 | 256 | 128 | 72 | 40 | 20 | 12 | 8 | 4 | 2 | 1 |

TABLE 3-continued

| Recombination | $2^6 - 25$ | $2^5 - 11$ | $2^4 - 5$ | $2^3 - 2$ | $2^2 - 1$ | $2^1$ | $2^0$ |
|---|---|---|---|---|---|---|---|
| Recombined Weight | 39 | 21 | 11 | 6 | 3 | 2 | 1 |

These recombined weights are shown on the capacitances of LSB DAC 610B in FIG. 6A. The range of SAR conversion is thus 84 LSB (i.e., the sum of capacitor units/LSBs in LSB DAC 610B).

As mentioned above, there are two additional capacitances/comparators in MSB DAC 610A/Flash ADC 620 in FIG. 6A. Each comparator module in Flash ADC 620 has a corresponding capacitance in MSB DAC 610A, so there are 16 comparator modules in Flash ADC 620 which generate DFlash <15:0> which is provided as the control word for the 16 capacitances in MSB DAC 610A. In Flash ADC 620, the first comparator decision threshold (for bit 0 of DFlash <15:0>) is set at 32 LSB, the second comparator (for bit 1 of DFlash <15:0>) is set at 32+64=96 LSB, and so on, as shown in Table 4 below.

TABLE 4

| Comparator n in Flash ADC 620 matching bit <n> of DFlash <15:0> | Decision Threshold (in LSB) | $V_{Flash}$ (in LSB) |
|---|---|---|
| 0 | 32 | 22 |
| 1 | 96 | 86 |
| 2 | 160 | 150 |
| 3 | 224 | 214 |
| 4 | 288 | 278 |
| 5 | 352 | 342 |
| 6 | 416 | 406 |
| 7 | 480 | 470 |
| 8 | 544 | 534 |
| 9 | 608 | 598 |
| 10 | 672 | 662 |
| 11 | 736 | 726 |
| 12 | 800 | 790 |
| 13 | 864 | 954 |
| 14 | 928 | 918 |
| 15 | 992 | 940 |

Figure 6B:
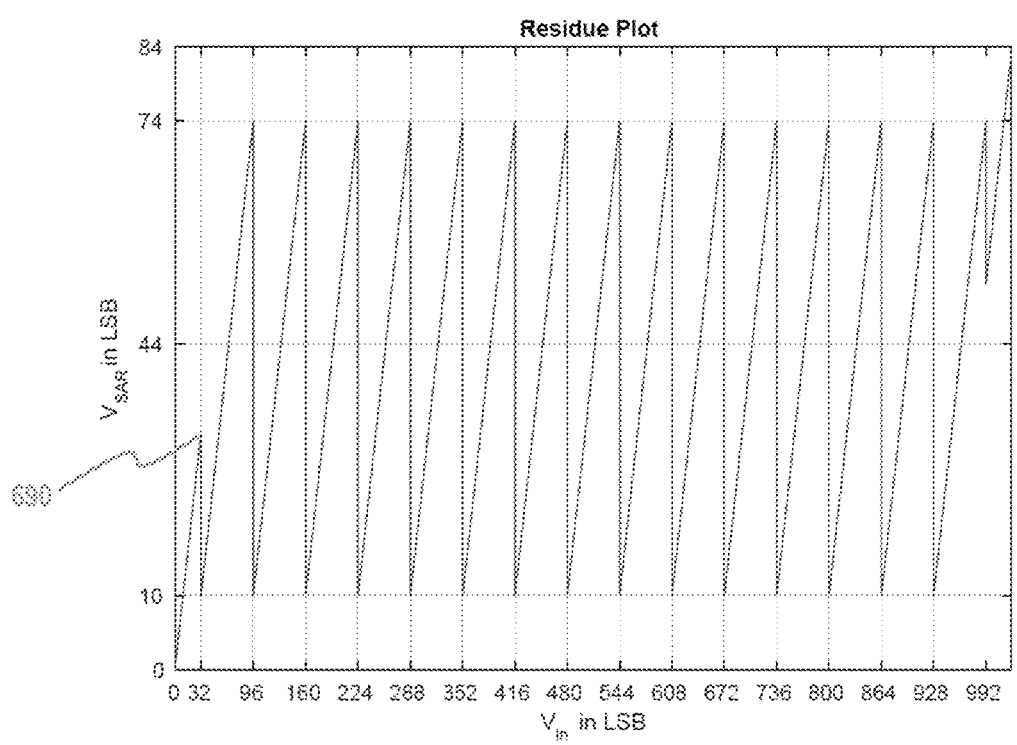
FIG. 6B is a graph plotting $V_{SAR}$, the analog input for SAR Register 620 in FIG. 6A, as a function of $V_{in}$ according to the embodiment in FIG. 6A in accordance with Table 4.

FIG. 6B shows a graph in which $V_{SAR}$, the analog input for SAR Register 620, is plotted as a function of $V_{in}$. The slope of the upward lines is always one, i.e., one LSB/capacitance unit change in $V_{in}$ results in one LSB/capacitance unit change in $V_{SAR}$. Whenever $V_{in}$ crosses the decision threshold of a comparator in Flash ADC 620, the $V_{FLASH}$ capacitance corresponding to that comparator module is "turned on" in MSB DAC 610A, and its capacitance value must be subtracted from analog input $V_{SAR}$ for SAR Register 620. For example, when $V_{in}$ crosses the first comparator decision threshold of 32 LSB at point 690 in FIG. 6B, $V_{FLASH}$ of capacitance <0>=22 LSB is subtracted from $V_{in}$ and $V_{SAR}$ becomes 10 LSB.

The range of possible offsets of each comparator from the values in Table 4 can be determined using the plot in FIG. 6B. For example, if the second comparator decision threshold is increased by 10 LSB, i.e., it is triggered at $V_{in}$=106 LSB, an input which is slightly lower than this would only trigger the first comparator and accordingly, $V_{SAR}$=106−22=84 LSB, which is right at the limit of SAR range. Any further increase in offset will result in missing codes at the ADC output. Accordingly, the allowed offset range from Table 4 for each comparator in Flash ADC 620 in FIG. 6B is only 10 LSB.

Returning to FIG. 6A, DFlash <15:0> from Flash ADC 620 and DLSAR <6:0>, the final output after 7 cycles of successive approximation, are input to Digital Combiner 650. Digital Combiner 650 performs the series of operations, represented by Equations (1)-(4):

$$DFlash \times CFlash \quad (1)$$

where CFlash corresponds to the weights in MSB DAC;

$$DSAR \times CSAR \quad (2)$$

where CSAR corresponds to the weights in LSB DAC;

$$T_D = DFlash \times CFlash + DSAR \times CSAR \quad (3)$$

where TD is the decimal total, which is converted to binary form before being output:

$$T_D \rightarrow \text{converted to binary} \rightarrow D_{out} \quad (4).$$

Although the formula above is written as multiplication, in reality it only requires bit-by-bit addition in binary logic.

Accordingly, in FIG. 6A, the values would be:

CFlash=[22 64 64 64 64 64 64 64 64 64 64 64 64 64 64 22]

CSAR=[39 21 11 6 3 2 1]

Figure 7:
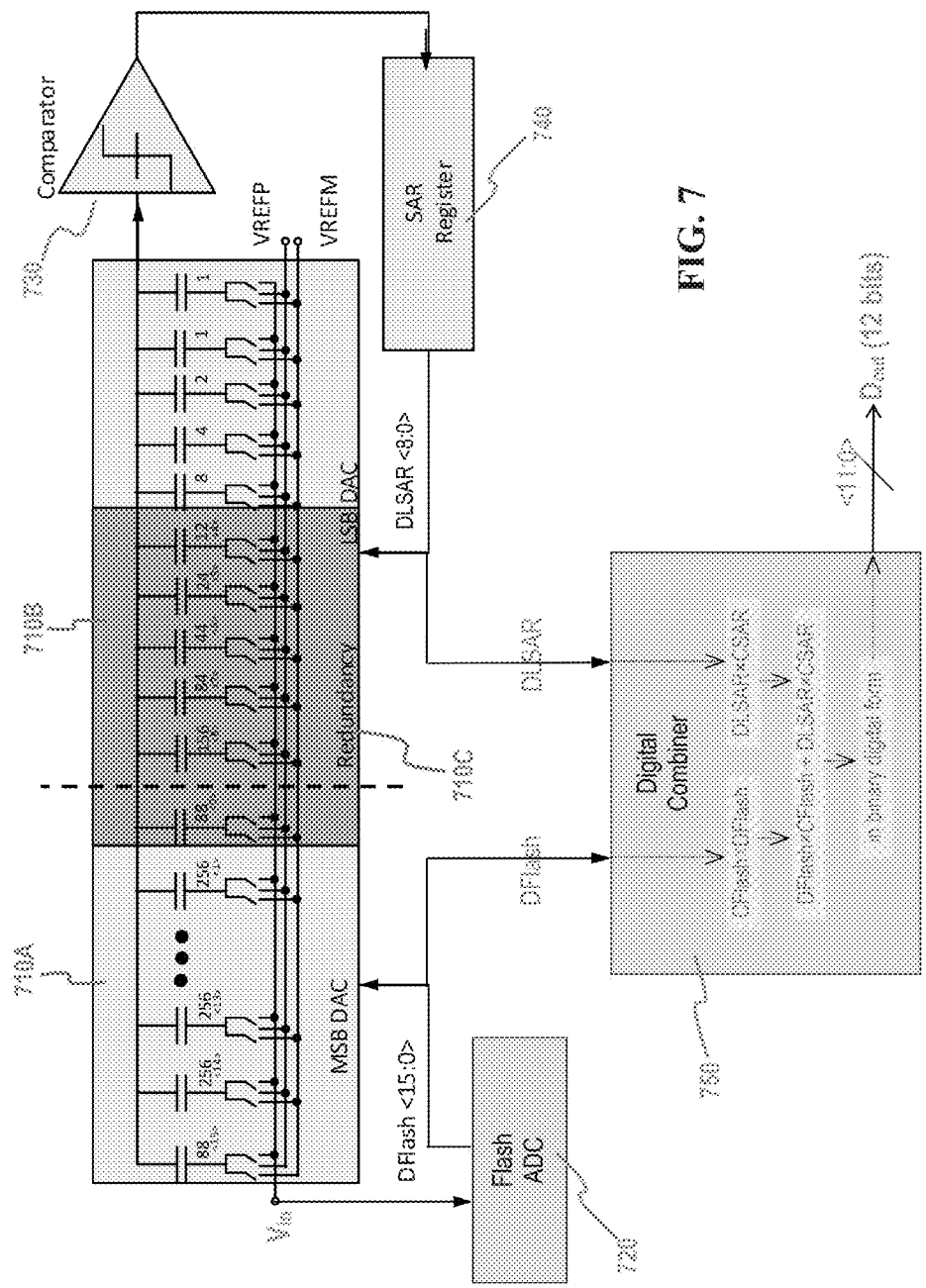
FIG. 7 is a twelve bit digital code Flash-assisted SAR ADC according to an embodiment of the present disclosure.

FIG. 7 is a twelve bit Flash-assisted SAR ADC using recombination and redundancy according to an embodiment of the present disclosure. Like FIG. 6A, the use of two additional capacitances/comparators in MSB DAC 710A/Flash ADC 720 in FIG. 7 makes it possible to reduce the number of extra cycles in comparison to the ADC in FIG. 4. Flash ADC 720 and MSB DAC 710A provide the 4 bit MSB equivalent digital estimate, while SAR 640 and MAC LSB 710B provide 8 bit LSB equivalent digital estimate. After combining, the desired 12 bit digital output is obtained.

However, the 4 MSBs in FIG. 7 have a much higher value, and thus MSB DAC 710A has a much larger "unit" value. When MSB DAC was for bits <9:6> of the ten bit output in FIG. 3, the unit value per capacitance was 64 capacitance units/LSBs, because that was the smallest unit: $2^6$=64. In FIG. 7, MSB DAC 710A is for bits <12:9>, where $2^9$=256 LSB. Moreover, the total output LSBs is not 1024 like FIG. 6A, but rather $2^{12}$=4096 LSBs. In an architecture like FIG. 3, the LSB DAC would have capacitances <8:0>, each corresponding to a binary bit, and the LSB DAC would total 512 LSBs. In an architecture like FIG. 4, the MSB DAC would have capacitances <14:1>, each corresponding to 256 capacitance units/LSBs, and the MSB DAC would total 3840 LSBs, which, with the 512 from LSB DAC, would total 4096.

However, in FIG. 7, like FIG. 6A, redundancy, recombination weighting, and the Flash ADC are integrated in such a manner to make it possible to reduce the number of cycles from the architectures shown in FIGS. 3 and 4. There are two additional capacitances in MSB DAC 710A: capacitance <0> having a value of 88 capacitance units/LSBs, and capacitance <15> having a value of 88 capacitance units/LSBs. The remaining capacitances in the middle are the same: 14 capacitances of 256 capacitance units/LSBs each, totalling 3584 capacitance units. Accordingly, MSB DAC 710A has an overall total of 3760 capacitance units/LSBS, 176 capacitance units/LSBS more than would be used in the architecture of FIG. 4. Like FIG. 6A, the extra 176 capacitance units/LSBs in MSB DAC 710A of FIG. 7 are recombined/subtracted from the LSB DAC 710B as shown in Table 5 below

TABLE 5

| Capacitance | $C_8$ | $C_7$ | $C_6$ | $C_5$ | $C_4$ | $C_3$ | $C_2$ | $C_1$ | $C_0$ |
|---|---|---|---|---|---|---|---|---|---|
| DLSAR bit | $b_8$ | $b_7$ | $b_6$ | $b_5$ | $b_4$ | $b_3$ | $b_2$ | $b_1$ | $b_0$ |
| Recombination | $2^8$-100 | $2^7$-44 | $2^6$-20 | $2^5$-8 | $2^4$-4 | $2^3$ | $2^2$ | $2^1$ | $2^0$ |
| Recombined Weight | 156 | 84 | 44 | 24 | 12 | 8 | 4 | 2 | 1 |

FIG. 7 shows redundancy area 710C, indicating the right-hand capacitance <0> in MSB DAC 710A and the capacitances in LSB DAC 710B which have been recombined, which are also shaded in Table 5 above. The range of SAR conversion is thus 336 LSB (i.e., the sum of capacitor units/LSBs in LSB DAC 710B).

Like FIG. 6A, there are 16 comparator modules in Flash ADC 720 which generate DFlash <15:0> which is provided as the control word for the 16 capacitances in MSB DAC 710A. In Flash ADC 720, the first comparator decision threshold (for bit <0> of DFlash <15:0>) is set at 128 LSB, the second comparator (for bit <1> of DFlash <15:0>) is set at 128+256=384 LSB, and so on, as shown in Table 6 below.

TABLE 6

| Comparator n in Flash ADC 720 matching bit <n> of DFlash <15:0> | Decision Threshold (in LSB) | $V_{Flash}$ (in LSB) |
|---|---|---|
| 0 | 128 | 88 |
| 1 | 384 | 344 |
| 2 | 640 | 600 |
| 3 | 896 | 856 |
| 4 | 1152 | 1112 |
| 5 | 1408 | 1368 |
| 6 | 1664 | 1624 |
| 7 | 1920 | 1880 |
| 8 | 2176 | 2136 |
| 9 | 2432 | 2392 |
| 10 | 2688 | 2648 |
| 11 | 2944 | 2904 |
| 12 | 3200 | 3160 |
| 13 | 3456 | 3416 |
| 14 | 3712 | 3672 |
| 15 | 3968 | 3760 |

In various embodiments according to the present disclosure, redundancy, recombination weighting, and using a Flash ADC are integrated in such a manner to make it possible to reduce the number of cycles. In this manner, most of the benefits of using a flash ADC are retained while still relaxing the requirements for reference and DAC settling.

Accordingly, as shown above, the speed, accuracy, and/or resource-usage of an ADC is improved by combining topologies. More specifically, Flash and SAR topologies are combined to create a hybrid Flash-assisted SAR ADC. The Flash ADC is used to approximate the coarse bits, or Most Significant Bits (MSBs), while the SAR ADC processes the fine bits, or Least Significant Bits (LSBs). In this manner, the MSBs are approximated in one clock cycle, while the LSBs are determined by multiple successive clock cycles, after which the output is combined to generate a result.

Depending on the embodiment of the present disclosure, steps and/or operations in accordance with the present disclosure may occur in a different order, or in parallel, or concurrently for different epochs, etc., in different embodiments, as would be understood by one of ordinary skill in the art. Similarly, as would be understood by one of ordinary skill in the art, FIGS. 2-7 are simplified representations of the actions performed, and real-world implementations may perform the actions in a different order or by different ways or means. Similarly, as simplified representations, FIGS. 2-7 do not show other required steps as these are known and understood by one of ordinary skill in the art and not pertinent and/or helpful to the present description.

Depending on the embodiment of the present disclosure, some or all of the steps and/or operations may be implemented or otherwise performed, at least in part, on a portable device. "Portable device" as used herein refers to any portable, mobile, or movable electronic device having the capability of receiving wireless signals, including, but not limited to, multimedia players, communication devices, computing devices, navigating devices, etc. Thus, mobile devices include, but are not limited to, laptops, tablet computers, Portable Digital Assistants (PDAs), mp3 players, handheld PCs, Instant Messaging Devices (IMD), cellular telephones, Global Navigational Satellite System (GNSS) receivers, watches, cameras or any such device which can be worn and/or carried on one's person. "User Equipment" or "UE" as used herein corresponds to the usage of that term in the 3GPP LTE/LTE-A protocols, but is not in any way limited by the 3GPP LTE/LTE-A protocols. Moreover, "User Equipment" or "UE" refers to any type of device, including portable devices, which acts as a wireless receiver.

Depending on the embodiment of the present disclosure, some or all of the steps and/or operations may be implemented or otherwise performed, at least in part, using one or more processors running instruction(s), program(s), interactive data structure(s), client and/or server components, where such instruction(s), program(s), interactive data structure(s), client and/or server components are stored in one or more non-transitory computer-readable media. The one or more non-transitory computer-readable media may be instantiated in software, firmware, hardware, and/or any combination thereof. Moreover, the functionality of any "module" discussed herein may be implemented in software, firmware, hardware, and/or any combination thereof.

As an example, various embodiments of the present disclosure could be implemented in a broadband modem chip, as would be understood by one of ordinary skill in the art, in view of the present disclosure.

The one or more non-transitory computer-readable media and/or means for implementing/performing one or more operations/steps/modules of embodiments of the present disclosure may include, without limitation, application-specific integrated circuits ("ASICs"), standard integrated circuits, controllers executing appropriate instructions (including microcontrollers and/or embedded controllers), field-programmable gate arrays ("FPGAs"), complex programmable logic devices ("CPLDs"), and the like. Some or all of any system components and/or data structures may also be stored as contents (e.g., as executable or other non-transitory machine-readable software instructions or structured data) on a non-transitory computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of any system components and data structures may also be stored as data signals on a variety of non-transitory computer-readable transmission mediums, from which they are read and then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced in any computer system configuration.

Thus, the term "non-transitory computer-readable medium" as used herein refers to any medium that comprises the actual performance of an operation (such as hardware circuits), that comprises programs and/or higher-level instructions to be provided to one or more processors for performance/implementation (such as instructions stored in a non-transitory memory), and/or that comprises machine-level instructions stored in, e.g., firmware or non-volatile memory. Non-transitory computer-readable media may take many forms, such as non-volatile and volatile media, including but not limited to, a floppy disk, flexible disk, hard disk, RAM, PROM, EPROM, FLASH-EPROM, EEPROM, any memory chip or cartridge, any magnetic tape, or any other magnetic medium from which a computer instruction can be read; a CD-ROM, DVD, or any other optical medium from which a computer instruction can be read, or any other non-transitory medium from which a computer instruction can be read.

While certain embodiments of the disclosure have been shown and described herein it will be understood by those skilled in the art that various changes in form and detail may be made without departing from the spirit and scope of the disclosure as defined by the appended claims.

What is claimed is:

1. An Analog-to-Digital Converter (ADC), comprising:
 a Capacitor Digital-to-Analog Converter (DAC) which receives digital approximations of an input analog voltage as input and generates an analog voltage based on the digital approximations as output, comprising:
  a first DAC related to Most Significant Bits (MSBs) of the binary output, which uses thermometer coding, receives first digital approximations and generates a corresponding first analog voltage, comprising:
   a plurality of capacitances of equal value $C_{common}$ and one or more capacitances of a different value $C_{red}$; and
  a second DAC related to Least Significant Bits (LSBs) of the binary output, which is non-binary, receives second digital approximations and generates a corresponding second analog voltage, comprising:
   a plurality of capacitances equalling the sum of binary capacitances of the LSBs subtracted by the one or more capacitances of a different value $C_{red}$;
 a comparator which generates a comparator value indicating the input analog voltage subtracted by the first analog voltage generated by the first DAC;
 a Successive Approximation Register (SAR) which receives the comparator value and generates the second digital approximations which are input to the second DAC, wherein the SAR repeats this process in successive approximation;
 a Flash-assisted ADC which receives the input analog voltage and generates first digital approximations which are input into the first DAC; and
 a digital combiner which receives the first digital approximations from the Flash-assisted ADC and the second digital approximations from the SAR and generates a binary output representing the conversion of the input analog voltage.

2. The ADC of claim 1, wherein the digital combiner multiplies the first digital approximations by the weights of the capacitances in the first DAC and multiplies the second digital approximations by the weights of the capacitances in the second DAC, adds the results, and converts the sum into binary form to generate a binary output representing the conversion of the input analog voltage.

3. The ADC of claim 1, wherein the Flash-assisted ADC comprises:
 a comparator for each bit in the first digital approximation, wherein each comparator has a threshold.

4. The ADC of claim 1, wherein the input analog voltage is being converted to an N-bit binary output, and the total number of capacitances in Capacitor DAC is $2^N$.

5. The ADC of claim 4, wherein $M_L$ is the lowest bit position in the MSBs, $n_{MSB}$ is the number of bit positions in the MSBs, $C_{common}=2^{M_L}$ capacitance units/LSBs, the number of capacitances of $C_{common}$ value in the first DAC is $2^{n_{MSB}}-2$, and the one or more capacitances of a different value $C_{red}$ comprise two capacitances in the first DAC, both having a capacitance value of $C_{red}$.

6. The ADC of claim 5, where in the first digital approximations for the first DAC comprise a $2^{n_{MSB}}$ bit thermometer coded input, where the lowest bit is for one of the capacitances of value $C_{red}$, the next $2^{n_{MSB}}-2$ bits are for the capacitances of equal value $C_{common}$, and the highest bit is for the other capacitance of value $C_{red}$.

7. The ADC of claim 5, wherein and $L_H$ is the highest bit position in the LSBs and the overall capacitance of the second DAC is $2^{L_H-1}+2^{L_H-2}+\ldots+2^0-2C_{red}$.

8. The ADC of claim 4, wherein N=10, the first DAC has 14 capacitances of $C_{common}$=64 capacitance units/LSBs, and two capacitances of $C_{red}$=22 capacitance units/LSBs, and the second DAC has capacitances with weights of 39, 21, 11, 6, 3, 2, and 1, as well as a termination capacitance equalling one capacitance unit/LSB.

9. The ADC of claim 8, wherein the Flash-assisted ADC comprises:
 a comparator for each bit in the first digital approximation, wherein each comparator has a threshold, as shown in the table below:

| Comparator n in Flash ADC 620 matching bit <n> of DFlash <15:0> | Decision Threshold (in LSB) | $V_{Flash}$ (in LSB) |
|---|---|---|
| 0 | 32 | 22 |
| 1 | 96 | 86 |
| 2 | 160 | 150 |
| 3 | 224 | 214 |
| 4 | 288 | 278 |
| 5 | 352 | 342 |
| 6 | 416 | 406 |
| 7 | 480 | 470 |
| 8 | 544 | 534 |
| 9 | 608 | 598 |
| 10 | 672 | 662 |
| 11 | 736 | 726 |
| 12 | 800 | 790 |
| 13 | 864 | 954 |
| 14 | 928 | 918 |
| 15 | 992 | 940 |

10. The ADC of claim 4, wherein N=12, the first DAC has 14 capacitances of $C_{common}$ 256 capacitance units/LSBs, and two capacitances of $C_{red}$=88 capacitance units/LSBs, and the second DAC has capacitances with weights of 156, 84, 44, 24, 12, 8, 4, 2, and 1, as well as a termination capacitance equalling one capacitance unit/LSB.

11. A broadband modem chip, comprising:
an Analog-to-Digital Converter (ADC), comprising:
a Capacitor Digital-to-Analog Converter (DAC) which receives digital approximations of an input analog voltage as input and generates an analog voltage based on the digital approximations as output, comprising:
a first DAC related to Most Significant Bits (MSBs) of the binary output, which uses thermometer coding, receives first digital approximations and generates a corresponding first analog voltage, comprising:
a plurality of capacitances of equal value $C_{common}$ and one or more capacitances of a different value $C_{red}$; and
a second DAC related to Least Significant Bits (LSBs) of the binary output, which is non-binary, receives second digital approximations and generates a corresponding second analog voltage, comprising:
a plurality of capacitances equalling the sum of binary capacitances of the LSBs subtracted by the one or more capacitances of a different value $C_{red}$;
a comparator which generates a comparator value indicating the input analog voltage subtracted by the first analog voltage generated by the first DAC;
a Successive Approximation Register (SAR) which receives the comparator value and generates the second digital approximations which are input to the second DAC, wherein the SAR repeats this process in successive approximation;
a Flash-assisted ADC which receives the input analog voltage and generates first digital approximations which are input into the first DAC; and
a digital combiner which receives the first digital approximations from the Flash-assisted ADC and the second digital approximations from the SAR and generates a binary output representing the conversion of the input analog voltage.

12. The broadband modem chip of claim 11, wherein the digital combiner multiplies the first digital approximations by the weights of the capacitances in the first DAC and multiplies the second digital approximations by the weights of the capacitances in the second DAC, adds the results, and converts the sum into binary form to generate a binary output representing the conversion of the input analog voltage.

13. The broadband modem chip of claim 11, wherein the Flash-assisted ADC comprises:
a comparator for each bit in the first digital approximation, wherein each comparator has a threshold.

14. The broadband modem chip of claim 11, wherein the input analog voltage is being converted to an N-bit binary output, and the total number of capacitances in Capacitor DAC is $2^N$.

15. The broadband modem chip of claim 14, wherein $M_L$ is the lowest bit position in the MSBs, $n_{MSB}$ is the number of bit positions in the MSBs, $C_{common}=2^{M_L}$ capacitance units/LSBs, the number of capacitances of $C_{common}$ value in the first DAC is $2^{n_{MSB}}-2$, and the one or more capacitances of a different value $C_{red}$ comprise two capacitances in the first DAC, both having a capacitance value of $C_{red}$.

16. The broadband modem chip of claim 14, wherein and $L_H$ is the highest bit position in the LSBs and the overall capacitance of the second DAC is $2^{L_H-1}+2^{L_H-2}+\ldots+2^0-2C_{red}$.

17. An Analog-to-Digital Converter (ADC) for converting input analog to an N-bit binary output, divided into Most Significant Bits (MSBs) and Least Significant Bits (LSBs), where $n_{MSB}$ is the number of bit positions in the MSBs and $M_L$ is the lowest bit position in the MSBs, and $L_H$ is the highest bit position in the LSBs, comprising:
a Capacitor Digital-to-Analog Converter (DAC) comprising $2^N$ capacitance units/LSBs, divided into:
a thermometer coded DAC comprising:
$2^{n_{MSB}}-2$ capacitances of equal value $C_{common}$, where $C_{common}=2^{M_L}$ capacitance units/LSBs; and
2 capacitances of value $C_{red}$; and
a non-binary DAC comprising:
$L_H+1$ capacitances, as well as a termination capacitance equalling one capacitance unit/LSB;
a Flash-assisted ADC which receives the input analog voltage and generates a $2^{n_{MSB}}$ bit thermometer coded input for the first DAC, where the lowest bit is for one of the capacitances of value $C_{red}$, the next $2^{n_{MSB}}-2$ bits are for the capacitances of equal value $C_{common}$, and the highest bit is for the other capacitance of value $C_{red}$;
a Successive Approximation Register (SAR) which generates a $L_H+1$ bit input for the non-binary DAC; and
a digital combiner which receives the $2^{n_{MSB}}$ bit thermometer coded output of the Flash-assisted ADC and, after successively approximated over $L_H+1$ cycles, the $L_H+1$ bit output of the SAR and generates a binary output representing the conversion of the input analog voltage,
wherein the $2^{n_{MSB}}+2$ capacitances of the thermometer coded DAC and the $L_H+1$ capacitances, as well as a termination capacitance equalling one capacitance unit/LSB, in the non-binary DAC equal a total value of $2^N$ capacitance units/LSBs.

18. The ADC of claim 17, wherein the digital combiner multiplies the $2^{n_{MSB}}$ bit thermometer coded output by the weights of the capacitances in the thermometer coded DAC and multiplies the $L_H+1$ capacitances by the weights of the capacitances in the non-binary DAC, adds the results, and converts the sum into binary form to generate a binary output representing the conversion of the input analog voltage.

19. The ADC of claim 17, further comprising:
a comparator which generates a comparator value indicating a difference of the input analog voltage and the analog voltage generated by the thermometer-coded DAC,
wherein the SAR receives the comparator value as input to generate the $L_H+1$ bit input for the non-binary DAC.

20. The ADC of claim 17, wherein the Flash-assisted ADC comprises:
a comparator for each bit in the $2^{n_{MSB}}$ bit thermometer coded output, wherein each comparator has a threshold.

* * * * *